United States Patent
Pissis et al.

(10) Patent No.: US 11,876,350 B2
(45) Date of Patent: Jan. 16, 2024

(54) MULTI-WAVELENGTH VCSEL ARRAY AND METHOD OF FABRICATION

(71) Applicant: II-VI Delaware, Inc., Wilmington, DE (US)

(72) Inventors: Antoine Philippe Pissis, Zurich (CH); Evgeny Zibik, Zurich (CH)

(73) Assignee: II-VI DELAWARE, INC., Wilmington, DE (US)

( * ) Notice: Subject to any disclaimer, the term of this patent is extended or adjusted under 35 U.S.C. 154(b) by 511 days.

(21) Appl. No.: 17/097,330

(22) Filed: Nov. 13, 2020

(65) Prior Publication Data

US 2022/0158417 A1    May 19, 2022

(51) Int. Cl.
*H01S 5/42*    (2006.01)
*H01S 5/02*    (2006.01)
(Continued)

(52) U.S. Cl.
CPC ............ *H01S 5/423* (2013.01); *H01S 5/0206* (2013.01); *H01S 5/18311* (2013.01);
(Continued)

(58) Field of Classification Search
CPC .. H01S 5/423; H01S 5/18311; H01S 5/18394; H01S 5/4087; H01S 2304/02; H01S 2304/04
See application file for complete search history.

(56) References Cited

U.S. PATENT DOCUMENTS

| 5,109,386 A | 4/1992 | Bradley |
| 5,111,467 A | 5/1992 | Bradley |

(Continued)

FOREIGN PATENT DOCUMENTS

| CN | 107332105 A | 11/2017 |
| CN | 107768979 A | 3/2018 |

(Continued)

OTHER PUBLICATIONS

Demeulenaere, et al., Detailed study of AlAs-oxidized apertures in VCSEL cavities for optimized modal performance, IEEE Journal of Quantum Electronics, 1999, 35:3: 358-367.

(Continued)

*Primary Examiner* — Yuanda Zhang
(74) *Attorney, Agent, or Firm* — Blank Rome LLP (57) ABSTRACT

A vertical cavity surface emitting laser (VCSEL) array is fabricated to produce multiple wavelengths. A first distributed Bragg reflector (DBR) is formed on a substrate, and an optical layer having an active region is formed on the first DBR. The optical layer has a variation in optical characteristic configured to generate multiple wavelengths. To do this, a first portion of the layer is formed on the first DBR. Different dimensioned features (profiles, wells, trenches, gratings, etc.) are then formed on a surface of the first portion. Subsequently, a second portion of the layer is formed by filling in the dimensioned features on the first portion's surface. Finally, a second DBR is formed on the second portion of the layer. The variation in optical characteristic can include variation in refractive index, physical thickness, or both. The assembly can be processed as usual to produce a VCSEL array having multiple emitters.

20 Claims, 9 Drawing Sheets

(51) Int. Cl.
*H01S 5/183* (2006.01)
*H01S 5/40* (2006.01)

(52) U.S. Cl.
CPC ........ *H01S 5/18394* (2013.01); *H01S 5/4087* (2013.01); *H01S 2304/02* (2013.01); *H01S 2304/04* (2013.01)

(56) References Cited

U.S. PATENT DOCUMENTS

| | | |
|---|---|---|
| 5,448,581 A | 9/1995 | Wu et al. |
| 6,156,582 A | 12/2000 | Shieh et al. |
| 6,566,688 B1 | 5/2003 | Zhang et al. |
| 6,678,300 B2 | 1/2004 | Johnson et al. |
| 6,829,281 B2 | 12/2004 | Deng et al. |
| 6,841,407 B2 | 1/2005 | Coldren et al. |
| 7,304,781 B2 | 12/2007 | Chang-Hasnain et al. |
| 7,308,011 B2 | 12/2007 | Johnson et al. |
| 7,627,018 B1 | 12/2009 | Guilfoyle et al. |
| 7,679,059 B2 | 3/2010 | Zhou |
| 8,340,528 B2 | 12/2012 | Tatum et al. |
| 8,913,638 B2 | 12/2014 | Gideon et al. |
| 9,203,215 B2 | 12/2015 | Makino et al. |
| 9,323,070 B2 | 4/2016 | Petrus et al. |
| 9,595,809 B2 | 3/2017 | Uchida |
| 9,640,616 B2 | 5/2017 | Augusto |
| 9,705,284 B1 | 7/2017 | Cheskis |
| 9,709,381 B2 | 7/2017 | Uchida |
| 9,762,031 B2 | 9/2017 | Makino et al. |
| 10,439,360 B1 | 10/2019 | Cheskis |
| 10,693,277 B2 | 6/2020 | Graham et al. |
| 2003/0147439 A1 | 8/2003 | Shams-Zadeh-Amiri et al. |
| 2004/0258119 A1 | 12/2004 | Shams-Zadeh-Amiri et al. |
| 2010/0128749 A1* | 5/2010 | Amann ............... H01S 5/18308 257/E21.085 |
| 2012/0093189 A1* | 4/2012 | Fattal .................... B82Y 20/00 372/50.11 |
| 2012/0128019 A1* | 5/2012 | Chang-Hasnain ...... H01S 5/423 372/45.01 |
| 2019/0207369 A1 | 7/2019 | Graham et al. |
| 2019/0393678 A1 | 12/2019 | Graham et al. |

FOREIGN PATENT DOCUMENTS

| | | |
|---|---|---|
| CN | 109449753 A | 3/2019 |
| CN | 109244828 B | 9/2019 |
| GB | 2437593 A | 10/2007 |
| GB | 2437784 A | 11/2007 |

OTHER PUBLICATIONS

Gordon Morrison, B.A.Sc., Thesis, Modelling The Spectra of Distributed Feedback Lasers, McMaster University, 2002, 257 pages.

Hall, et al., Selectively Etched Undercut Apertures in AlAsSb-Based VCSELs, 2001, IEEE Photonics Technology Letters, 13:2:97-99.

Lee, Eun-Gu et al., Compactly Packaged Monolithic four-wavelength VCSEL array with 100-Ghz wavelength spacing for future-proof mobile fronthaul transport, Optics Express, vol. 23, No. 1, dated Jan. 12, 2015, 8-pgs.

* cited by examiner

MULTI-WAVELENGTH VCSEL ARRAY AND METHOD OF FABRICATION

FIELD OF THE DISCLOSURE

The subject matter of the present disclosure relates to a vertical cavity surface emitting laser (VCSEL) and, more particularly, relates to a VCSEL array capable of emitting multiple wavelengths using intra-cavity dimensioned features and relates to a method to fabricate such a VCSEL array.

BACKGROUND OF THE DISCLOSURE

A Vertical-Cavity Surface-Emitting Laser (VCSEL) is a semiconductor laser diode having a monolithic laser resonator. The typical structure of the VCSEL has a substrate with a laser resonator disposed thereon. The substrate can be from a gallium arsenide (GaAs) wafer. The laser resonator for the VCSEL has two distributed Bragg Reflectors (DBR) disposed parallel to one another on the substrate and separated by an active region having one or more quantum wells. The two DBRs are oppositely doped as p-type and n-type materials to provide corresponding carriers to a diode junction formed in the laser cavity. Each of the DBRs consist of layers having alternating high and low refractive indices, and each layer has a thickness of a quarter of the laser wavelength in the material.

When operated, current is supplied to the VCSEL by ohmic contacts disposed on the substrate and disposed on top of the second DBR. Electrically pumped with the current (e.g., a few milliampers), the active region generates an output power in the range from 0.5 to 5 mW or the like. The laser emission generated takes place along the longitudinal axis of the VCSEL.

An array of VCSEL emitters can provide higher power output by having multiple emitters arranged in a two-dimensional configuration. The array may have from two to hundreds of the emitters, and the emitters can be arranged within an outer shape, which is often a rectangular chip or other shape. In general, the emitters are spaced at a given pitch from one another. Each emitter has a small dimension and can provide a fraction of the overall output power. Depending on the implementation, for example, each of the emitters of the array may have a diameter between 5-μm and 20-μm and may provide output power between a few milliwatts to some tens of milliwatts. The spacing (pitch) between the emitters can vary due to fabrication limitations and to reduce heat generation.

At the wafer-scale, fabrication of a VCSEL array is comparable to the steps taken to fabricate a plurality of separate emitters on a wafer. Making the VCSEL array may simply require some additional steps to provide the appropriate electrical connections.

A VCSEL array capable of emitting multiple wavelengths is of interest in the industry. However, the fabrication of such a multiple wavelength VCSEL array presents a number of challenges. In one implementation, a multiple-wavelength VCSEL array is fabricated by intentionally grading the thickness of one or more layers. This graded thickness creates a cavity variation leading to laser wavelength variation.

Figure 12:
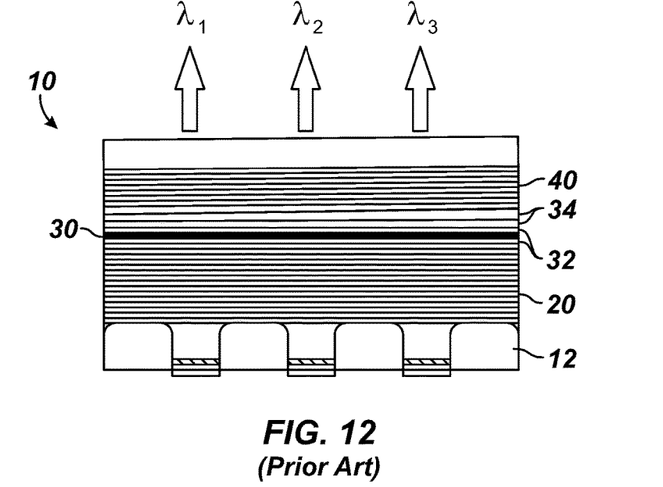
FIG. 12 illustrates a cross-section of a VCSEL capable of multiple wavelengths according to the prior art.

As an example, FIG. 12 illustrates a cross-section of a VCSEL 10 according to the prior art capable of emitting multiple wavelengths. The VCSEL 10 includes proton implants 12, a first distributed Bragg reflector (DBR) 20, an active layer 30, cavity layers 32, and a second distributed Bragg reflector (DBR) 40.

As shown, the VCSEL 10 is capable of emitting multiple wavelengths (e.g., $\lambda 1$, $\lambda 2$, $\lambda 3$). In this type of device, the multiple wavelengths are obtained by introducing a gradient in the growth rate over the wafer during the single epitaxial growth of the VCSEL 10. The graded growth rates have been achieved by using Metalorganic Vapor-Phase Epitaxy (MOVPE) growth on non-planar substrates or by using Molecular beam epitaxy (MBE) growth without the rotation of the substrate. As is known, the chemical vapor deposition process used in MOVPE grows multiple layers using the chemical reaction between reactant gases combined at elevated temperatures in a reactor. Resulting materials from the reaction deposit as a new layer on a substrate or previous layer.

As shown in particular in FIG. 12, the graded growth rates produce thickness-graded layers 34, which lie between the oppositely-doped DBRs 20, 40. During operation, the proton implants 12 guide current into the active region 30, which has multiple quantum wells. The thickness-graded layers 34 create a variation in the cavity thickness between the DBRs 20, 40, which produces variations in the laser wavelength generated.

Producing a multi-wavelength VCSEL with single growth and a graded growth rate as noted above has a number of limitations. Tuning the growth rate with MOVPE on a non-planar substrate requires a large distance of separation for the resulting emitters. Increased separation between the emitter is not desired for a dense VCSEL array. Additionally, tuning the growth rate with non-rotational MBE requires extra alignment control between the wafer and the material sources during the growth. This may not be practical or achievable for large volume production.

In another implementation for a multiple-wavelength VCSEL array, the VCSEL is fabricated to have high contrast gratings with different lateral dimensions instead of a top DBR. The high contrast gratings can be configured for different laser wavelengths in the array. See e.g., Karagodsky, Vadim, et al., "Monolithically integrated multi-wavelength VCSEL arrays using high-contrast gratings," Optics Express 18.2 (2010): 694-699.

Yet another approach to achieve multiple wavelength emission for a VCSEL array fabricates the VCSEL using a two-step epitaxial process and selective VCSEL cavity etching by growing the cavity with cavity control layers. For example, FIGS. 13A through 13D illustrate schematic cross-sections of a VCSEL 50 capable of multiple wavelengths during stages of fabrication according to the prior art. Details of the fabrication are provided in E. G. Lee et al., "Compactly packaged monolithic four-wavelength VCSEL array with 100-GHz wavelength spacing for future-proof mobile fronthaul transport", Optics Express Vol 23, N 1, p 284-291 (2015).

Figure 13A:
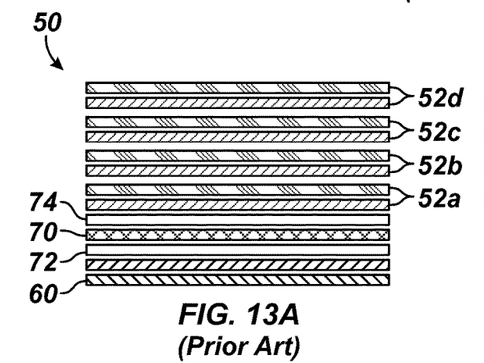
FIG. 13A through 13D illustrate cross-sections of a VCSEL capable of multiple wavelengths during stages of fabrication according to the prior art.
Figure 13B:
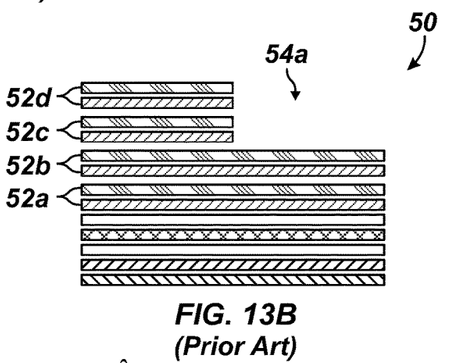

As shown in FIG. 13A, the fabrication process produces a bottom distributed Bragg reflector (DBR) 60, an active layer 70 between cavity layers 72 and 74, and a plurality of cavity control layers 52a-d. To obtain four different wavelengths from the single VCSEL 50, four layered pairs 52a-d of cavity control layers are used. After growing the cavity control layers 52a-d, a selective etching technique is then used to selectively etch the layered pairs 52a-d. As shown in FIG. 13B, two layered pairs 52c-d are selectively etched 54a using two iterations of binary-coded selective wet etching.

Figure 13C:
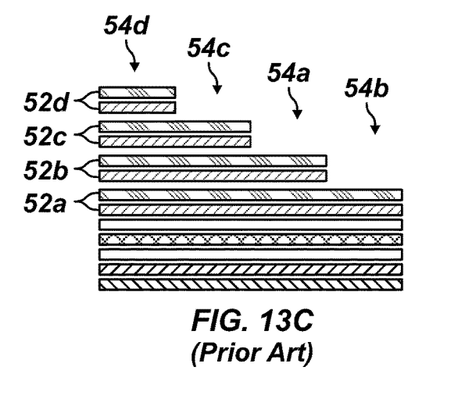
Figure 13D:
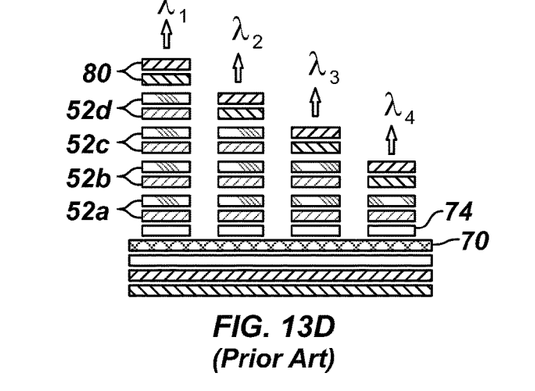

As shown in FIG. 13C, different cavity lengths 54a-d for the VCSEL 50 are then obtained by applying the binary-coded selective wet etching to the pair 52a-d of cavity control layers positioned at different areas. To complete the VCSEL 50 as shown in FIG. 2D, a top DBR 80 is formed on the cavity control layers 52a-d during regrowth, and additional cavity etching is performed. In the end, the VCSEL wavelength is varied here by changing the cavity thickness.

As can be seen in FIGS. 13A-13D, introduction of the cavity control layers 54a-d for selective VCSEL cavity etching requires complex cavity design and growth and uses the multi-step, selective etching processes before overgrowth can be made for the top DBR 80. In this instance, the number of the possible wavelengths is limited to the number of such cavity control layers 54a-d used during fabrication and is limited by the complicated process of multiple selective etching steps required, making this a difficult method.

What is needed is a VCSEL array capable of emitting multiple wavelengths that requires a less complicated structure and fabrication to produce. To that end, the subject matter of the present disclosure is directed to overcoming, or at least reducing the effects of, one or more of the problems set forth above.

SUMMARY OF THE DISCLOSURE

A method according to the present disclosure is used to fabricate a vertical cavity surface emitting laser (VCSEL) assembly, which can include one or more individually addressable VCSEL emitters, one or more individually addressable arrays having a plurality of emitters, or other type of device. In the method, a first distributed Bragg reflector (DBR) is formed on a substrate, an optical layer is formed on the first DBR, and a second DBR is formed on the optical layer. The optical layer has an active region.

To form the optical layer, a first portion of the optical cavity is formed on at least a portion of the first DBR during an initial growth stage. In an etching stage, a plurality of dimensioned features are etched on a surface of the first portion of the optical layer. For example, these dimensioned features (profiles, cavities, trenches, wells, gratings, etc.) can be formed in a single etching process involving a lithographic step and an etching step (e.g., wet etching or reactive-ion etching to a depth based on a timed etch rate). Then, in an overgrowth stage, a second portion of the optical layer is formed by filling the dimensioned features on the surface of the first portion. This second portion of the optical layer may actually encompass forming layers of the second DBR directly on the dimensioned features or may encompass forming a distinct layer of cladding or confinement on which the second DBR is then formed.

By forming and filling the dimensioned features, variations in an optical characteristic of the optical layer can be produced where these variations are configured to generate a plurality of output wavelengths. For example, the variations in the optical characteristic can include a variation in refractive index, a variation in optical thickness, and a variation in both refractive index and optical thickness.

Embodiments of the present disclosure include a vertical cavity surface emitting laser (VCSEL) emitter fabricated by the disclosed method and include a vertical cavity surface emitting laser (VCSEL) array fabricated by the disclosed methods.

A device according to the present disclosure can be used for generating VCSEL emission at multiple wavelengths in response to current. The device comprises a substrate, a first distributed Bragg reflector (DBR), an optical layer, and a second DBR. The first DBR is disposed on the substrate, and the optical layer is disposed on at least a portion the first DBR. The optical layer comprises an active region responsive to the current, and the second DBR is disposed on the optical cavity.

A first portion of the optical layer disposed adjacent the first DBR, while a second portion of the optical layer is disposed between a surface of the first portion and the second DBR. A plurality of dimensioned features are defined in the surface to produce variations in an optical characteristic of the optical layer. In turn, these variations in the optical characteristic are configured to produce a plurality of output wavelengths in the VCSEL emission generated.

The foregoing summary is not intended to summarize each potential embodiment or every aspect of the present disclosure.

DETAILED DESCRIPTION OF THE DISCLOSURE

Figure 1:
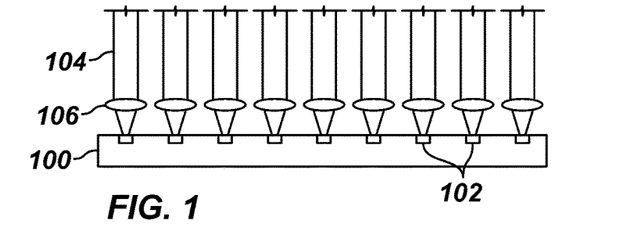
FIG. 1 illustrates a schematic of a VCSEL array having emitters according to the present disclosure.

FIG. 1 shows a vertical cavity surface emitting laser (VCSEL) array 100 having a plurality of emitters 102 according to the present disclosure. As noted, the VCSEL array 100 can provide higher power by arranging the multiple emitters 102 in a one-dimensional or two-dimensional arrangement on the substrate of the array 100. As will be appreciated, the array 100 can include a chip having a couple to hundreds of such emitters 102. Other configurations are possible depending on the overall device or the particular application in which the array 100 is to be used. Laser beams 104 generated by each of the emitters 102 can be collimated by an array of micro-lenses 106.

The VCSEL array 100 can be configured to provide a desired range of wavelengths. In one example, the VCSEL array 100 can be configured to provide a small range of multiple wavelengths. This can give a distinct (dense) wavelength separation by something like x-times 3 to 5-nm. The small range of wavelengths for the VCSEL array 100 could also be used to compensate for wavelength spread within the array 100 due to temperature gradients.

Figure 2:
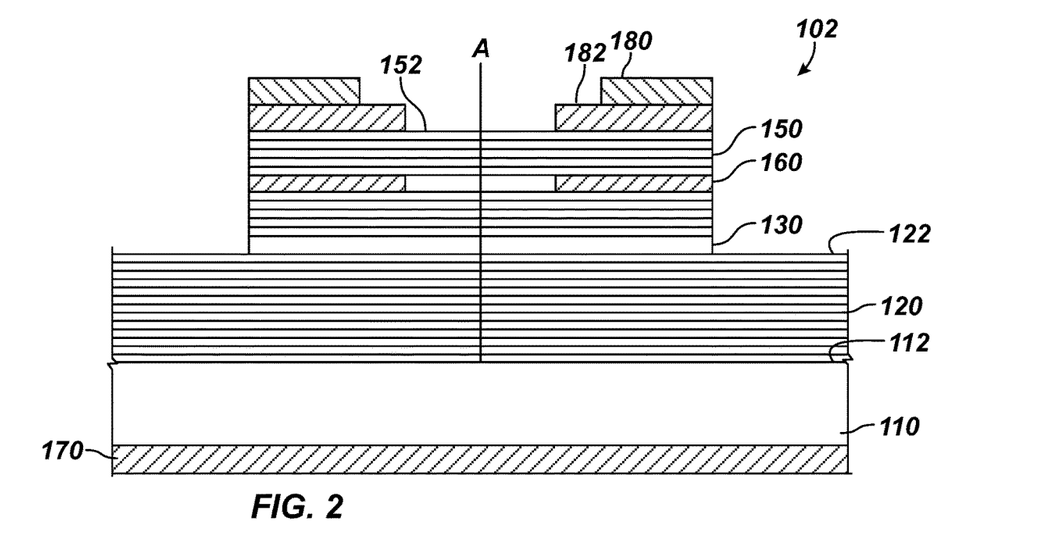
FIG. 2 illustrates a cross-section of a VCSEL emitter according to the present disclosure.

FIG. 2 illustrate a schematic cross-section a VCSEL emitter 102 of the present disclosure. Such an emitter 102 would be present along with other emitters on the VCSEL array as noted above. The VCSEL emitter 102 includes a substrate 110, a first distributed Bragg reflector (DBR) or mirror 120, an optical cavity 130 with an active region, and a second distributed Bragg reflector (DBR) or mirror 150.

The substrate 110 can be composed of an insulating material, a non-insulating material, or the like. The first DBR 120 is disposed on a surface 112 of the substrate 110. The optical cavity 130 having an active region is disposed at least partially on a surface 122 of the first DBR 120, and the second DBR 150 is disposed on the cavity 130.

As is typical, the first and second DBRs 120, 150 each include a set of alternating epitaxially-grown layers of two semiconductor materials having different indices of refraction. Each layer has a thickness configured to an operating parameter (e.g., operating wavelength) of the VCSEL emitter 102.

The elements are aligned on a longitudinal axis A along which laser radiation is emitted. In the present example and as is typical, an aperture layer 160 can be formed between the active region of the cavity 130 and the second DBR 150 to confine current flow to a central region of the VCSEL emitter 102. As will be appreciated, various techniques for forming an aperture and confining current in the VCSEL emitter 102 can be used.

A first ohmic contact 170 is disposed adjacent the first DBR 120 and can be arranged in a number of ways. For example, the first ohmic contact 170 can be placed on a partially thinned area on the substrate 110, or the first ohmic contact 170 can be a backside ohmic contact formed to the lower surface of first DBR 120. Other adjacent arrangements can be used.

A second ohmic contact 180 is disposed adjacent the second DBR 150 and can be arranged in a number of ways. For example, this contact 180 can be annular in shape and can be disposed on a contact layer 182 on the side 152 of the second DBR 150. Other adjacent arrangements can be used.

In the implementation where the substrate 110 is not an insulator, the substrate 110, the first DBR 120, and the first ohmic contact 170 are typically one type of conductivity, e.g., n-type, while the second DBR 150 and the second ohmic contact 180 are the opposite type of conductivity, i.e., p-type.

A number of conventional components, such as any electrical contacts, metal regions, via holes, electrodes for pumping, structures for current confinement, etc. may be used and may not be shown for simplicity. Arrangements of conventional components may be used other than those depicted here. A bottom-emitting VCSEL could also be fabricated.

As is conventional, the elements of the VCSEL emitter 102 can be shaped in a so-called mesa or air-post configuration with the lateral dimensions of the cavity 130, the second DBR 150, and the second ohmic contact 180 being appreciably smaller than the lateral dimensions of the first DBR 120 and the substrate 110. This configuration is formed during fabrication of the VCSEL emitter 102.

Optical interference between the radiation reflected at the interface between successive layers in the DBRs 120, 150 makes each DBR 120, 150 a highly effective reflector. Accordingly, the DBRs 120, 150 form a laser cavity. When a suitable current is applied across the ohmic contacts 170, 180, the active region of the optical cavity 130 having quantum wells generates the light, and the electrically conductive DBRs 120 and 150, acting as laser mirrors provide optical feedback for the amplifying layers in the cavity 130. The current can be confined to an active area by using a combination of the mesa etching of the second DBR 150 along with ion implantation or selective lateral oxidation for an aperture. Laser emission takes place from the second DBR 150, which has less layers and hence lower reflectivity than the first DBR 120.

According to the teachings of the present disclosure, the optical characteristic of the optical cavity 130 is locally modified using dimensioned features, which are formed by dividing the growth of the optical cavity 130 into two sub-growth steps separated by an etching step. (These dimensioned features can include profiles, cavities, wells, trenches, gratings, and the like.) This approach is independent of the growth rate used and can allow flexible control of the output wavelengths. When implemented in a VCSEL array 100 having multiple emitters 102, the spacing between the emitters 102 and the separation between the wavelengths does not require large distances because the fabrication is not restricted by the complexity of tuning a growth rate found in existing techniques noted in the Background of the present disclosure. In fact, the current approach allows different wavelengths to be defined in one selective etching step. Moreover, after the overgrowth, standard VCSEL fabrication processes can be used.

Figure 3:
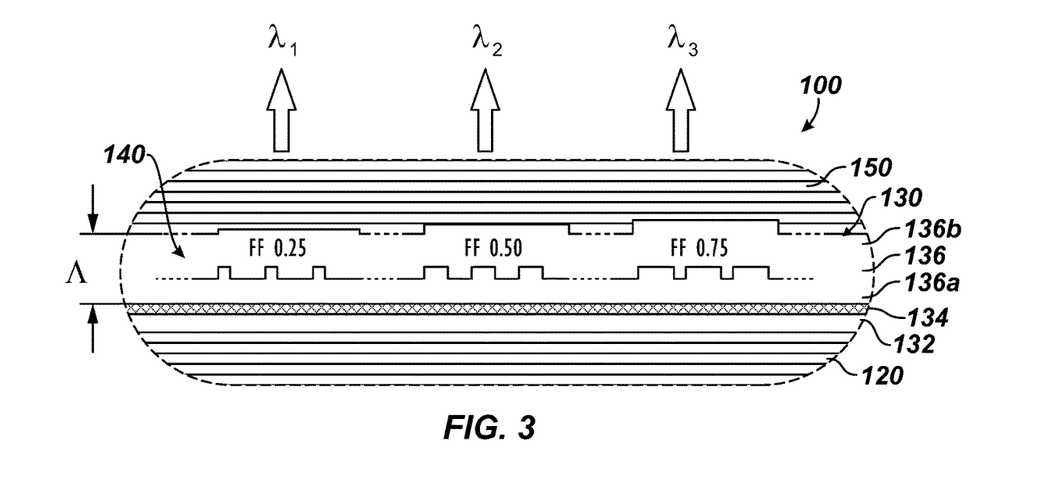
FIG. 3 illustrates a detail of a portion of a VCSEL according to the present disclosure.

For instance, FIG. 3 illustrates a detail of VCSEL layers during fabrication and reveals portions of the first DBR 120, the cavity 130, and the second DBR 150 for providing the VCSEL emitters (102) of a VCSEL array (100).

The optical cavity 130 includes an active region 134 between cavity layers 132, 136. The active region 134 typically includes one or more quantum wells in the form of thin quantum well layers of an appropriate material between barrier layers of another material. The active regions 134 can include quantum dots, quantum dashes, or the like. Some examples of appropriate materials include GaAs, InGaAs, AlGaAs, etc. depending on the implementation.

According to the present disclosure, the cavity layer 136 between the active region 134 and the second DBR 150 has been modified in its growth stage by dimensioned features 140, which are diagramed inside the layer 136. As diagramed, the dimensioned features 140 have dimensions of depth and width providing different filling factors FF. In this example, three filling factors FF of 0.25, 0.5 and 0.75 are represented. Fewer or more of these filling factors FF could be formed in the dimensioned features 140, and they can be arranged in different ways than depicted.

After growing a first portion 136a of the cavity layer 136 on the active region 134 during fabrication, the dimensioned features 140 are created. As discussed below, the dimensioned features can be features formed by photolithography and etching. Alternatively, the dimensioned features can be formed by electron-beam lithography, nanoimprinting lithography, or other process. Then, the dimensioned features 140 are filled by growing a remaining portion 136b of the cavity layer 136 followed by growth of the second DBR 150 thereon. By increasing the filling factor FF of the dimensioned features 140, less material is etched away. After overgrowth of the remaining portion of the cavity layer 136, the less etched away material can produce a locally thicker cavity thickness (Λ). Likewise, initial growth and the overgrowth with material of different refractive indices in the optical cavity 130 having the dimensioned features 140 can produce local variations in refractive index. In the end, the different filling factors FF can lead to different Fabry Perot wavelengths being generated.

In this example, the three filling factors FF lead to three increasing Fabry Perot wavelengths (λ1, λ2, λ3). Fewer or more of these Fabry Perot wavelengths could be produced. In summary, multiple wavelengths can be achieved according to the present disclosure by using the different filling factors FF in local areas of the optical cavity 130, resulting in different local cavity thicknesses (Λ) and/or different local refractive indices that engender different Fabry Perot wavelengths.

Figure 4:
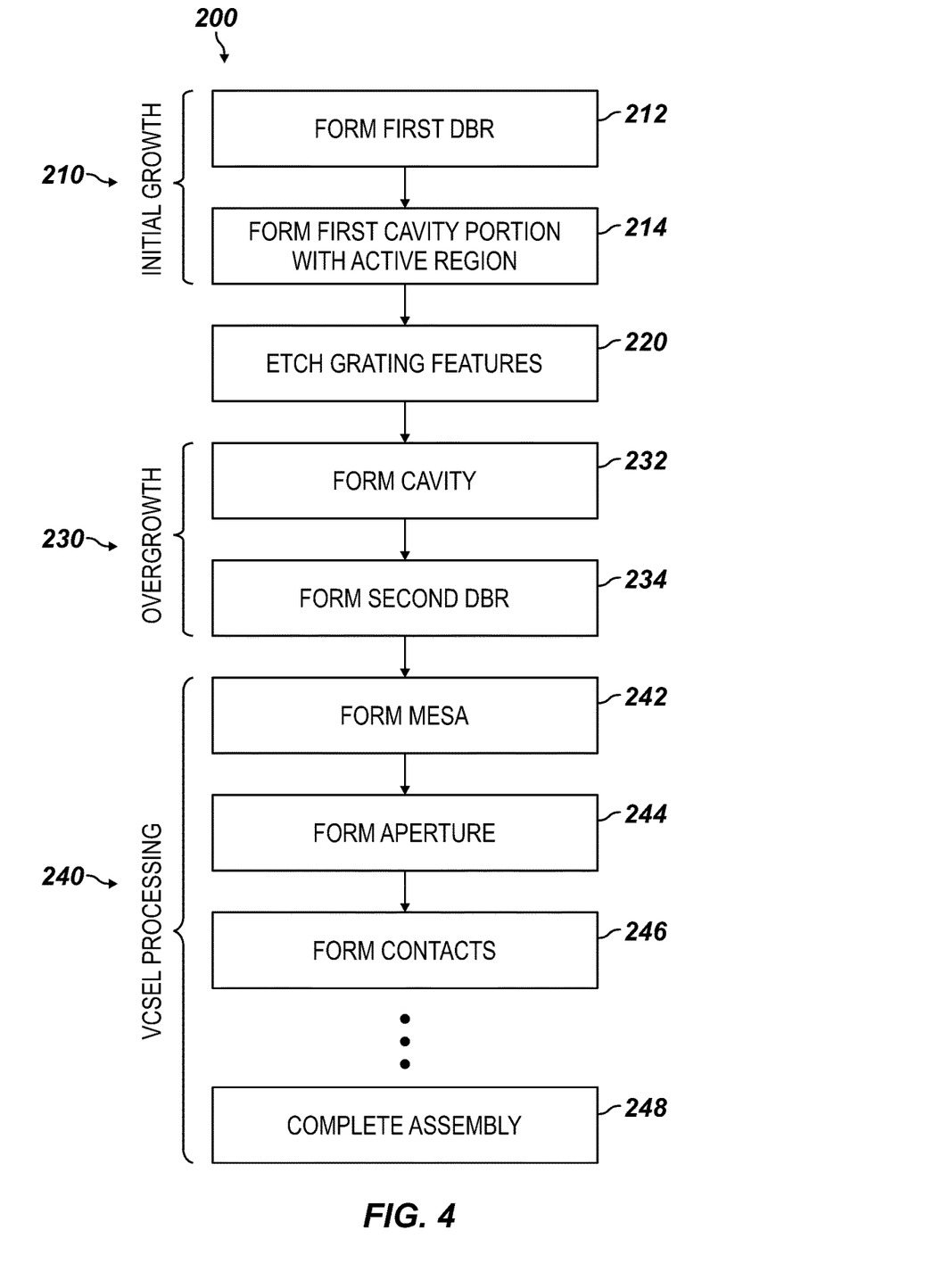
FIG. 4 is a flow chart depicting a process for fabricating a VCSEL array according to the present disclosure.

Having an understanding of a VCSEL array, emitters, and some details of their structure and fabrication, discussion now turns to further details. In particular, FIG. 4 is a flow chart depicting a process 200 for fabricating a VCSEL array 100 according to the present disclosure. In the interest of brevity, many of the processing details in the fabrication of the VCSEL array 100 may have been omitted, but will be familiar to those skilled in the art. For the sake of understanding, elements of the VCSEL array 100, emitters, and the like as depicted in other Figures are referenced in the description of the fabrication process 200.

As a typical starting point, a wafer of a semiconductor material, such as n-type GaAs, can be used as the substrate 110, and numerous identical devices (e.g. arrays 100 of emitters 102) can be formed simultaneously in the wafer, each of these devices can include one or more VCSELs emitters 102 of the type disclosed herein. After processing of the wafer is completed in the process 200 of FIG. 5A, the wafer can be broken apart into the individual devices (e.g., VCSEL arrays 100). As will be apparent, a portion of the wafer serves as the substrate 100 of each device.

The fabrication process 200 involves an initial growth stage (210), an etching stage (220), and an overgrowth stage (230). Finally, the process 200 can end with VCSEL processing steps (240), which prepare various structures of the assembly for use as a VCSEL device.

In the initial growth stage (210), the first distributed Bragg reflector 120 is formed on a surface 112 of the substrate 110 (Block 212). To do this, the first DBR 120 is formed by epitaxially growing alternating layers of first and second materials having different refractive indices. Each layer has a thickness of one quarter of the wavelength of the radiation to be emitted by the VCSEL 100. In the case of an n-GaAs substrate 110, the layers of first and second materials can be layers of n-type AlGaAs and GaAs. As will be appreciated, other material can be used as desired.

With the first DBR 120 completed, a first cavity layer 132 with an active region 134 is formed on the first DBR 120 (Block 214). The first cavity layer 132 can be a lower cladding or confinement layer of appropriate material (e.g., AlGaAs) formed on the surface 122 of the first DBR 120. The active region 134 is formed on the lower cladding layer 132 and can include several thin layers of quantum wells. These thin layers can be about 10 nm or less in thickness and can include layers for quantum wells and barriers. In this step, at least a first portion of an upper cladding or confinement layer 136a is also formed on the active region 130.

At this point, the initial growth stage (210) is stopped, and dimensioned features 140 are formed on the plane of the first cavity portion 136a of the upper cladding (Block 220). The dimensioned features 140 can be formed using photolithography and etching, electron-beam lithography, nanoimprint lithography, other process, or combination thereof if practical. At least one of first and second variations are produced in these steps of etching the features 140 and overgrowing on the dimensioned features 140. In particular and as hinted above, the cavity thickness and/or refractive index are changed, which varies the characteristics of the optical cavity 130. Particular details of the variations and the etching process are discussed separately with reference to FIGS. 5A-5C, 6A-6C, 7, 8A-8C, 9A-9B, 10A-10B and 11A-11C.

With the dimensioned features 140 formed, the process (200) proceeds to the overgrowth stage (230). Here, the cavity 130 is completed by forming a remaining cavity portion 136b of the upper cladding on the dimensioned features 140 on the plane of the first cavity portion 136a (Block 232). In some cases, the second DBR 150 can be grown directly on the dimensioned features 140 so that a distinct forming step of the remaining cavity portion 136b would not be necessary. Instead, forming the second DBR 150 would involve forming its layers directly on the dimensioned features 140.

With the cavity 130 completed, the overgrowth stage (230) continues with the second DBR 130 formed above the cavity 130 with its active region 134 (Block 234). Forming the second DBR 150 typically uses the same materials and the same processes used in forming the first DBR 120. However, the number of layers in the second DBR 150 may be, and typically is, greater than the number in the first DBR 120 so laser emission occurs from the second DBR 150. Of course, bottom emission can be achieved should more layers be present in the second DBR 150 than present in the first DBR 120. Also, the layers of the second DBR 150 have an opposite conductivity type.

The VCSEL processing stage (240) can then follow to complete the VCSEL 100. The steps in this processing stage (240) may vary depending on the implementation and how electrical connections are to be made. The order of the steps may differ from that described below depending on the implementation.

In general, portions of the layers for the second DBR 150 and the optical cavity 130 with the active region 134 can be removed to form the final mesa shape for the VCSEL noted previously (Block 242). Typically, the patterning of the second DBR 150 and the cavity 130 is performed using photolithographic or other processes.

If an aperture is to be formed, this can be done at an appropriate point in the process 200 (Block 244). In some processes, for example, a distinct layer of a given material, such as AlAs or AlGaAs, can be formed between the cavity 130 and second DBR 150. This distinct layer can be subsequently oxidized to form an oxide aperture by exposing that layer to a hot water vapor atmosphere. For a lithographic aperture VCSEL, the dimensioned features 140 are defined in a separate step, before etching of the lithographic aperture. (This can be done in process stage 220 either together with etching of grating features or in a separate lithographic step.) As an alternative, an aperture may be formed by ion implantation or by an oxidation process.

Continuing with the VCSEL processing (240), contacts can be formed on the assembly (Block 246). For example, a layer of contact metal can be formed on the upper surface of the VCSEL and placed in ohmic contact with the upper surface of the second DBR 150.

The other contacts can be formed in a number of ways, and additional features can be formed. For example, techniques as disclosed in U.S. Pat. Nos. 9,705,284 and 10,439,360, which are incorporated herein by reference, can be used to form a number of features, such as anti-reflection coating, via holes, insulation, conductive contacts, open region in the substrate 110, and the like. In the end, the wafer is then singulated to separate the individual VCSEL arrays for eventual integration into other devices and assemblies (Block 248).

As noted previously, varying the optical characteristics of the optical cavity 130 according to the present disclosure involves (i) using the filling factor (FF) produced by the dimensioned features 140 and the resulting variation in the optical thickness ($\Lambda$) to produce the different wavelengths and/or (ii) using the filling factor (FF) produced by the dimensioned features 140 and the resulting variation in the refractive index (n) to produce the different wavelengths. These variations depend on a number of variables, such as the number of layers, the thicknesses of the layers, the materials used in the layers, the desired wavelengths, the two dimensional aspects of the features 140 relative to a unit area, the depths (d) of the features 140 relative to a unit area, etc. The configuration of the variables depend on the particulars of an implementation.

Overall, the optical characteristic of the optical cavity 130 can be configured by varying the filling factor FF of the dimensioned features 140. The optical characteristic can be characterized locally as n×d, where n is the local refractive index of the cavity 130, and d is the local physical thickness of the cavity 130. This optical characteristic can be altered by either a change of physical thickness d, a change of refractive index n, or a change of both. Variation of the optical characteristic leads to various Fabry Perot wavelengths.

In the fabrication of the cavity 130 according to the present techniques, the physical thickness d is locally altered using the dimensioned features 140. As such, a shift of Fabry Perot wavelength is given by the average optical thickness of the material etched away.

Figure 5A:
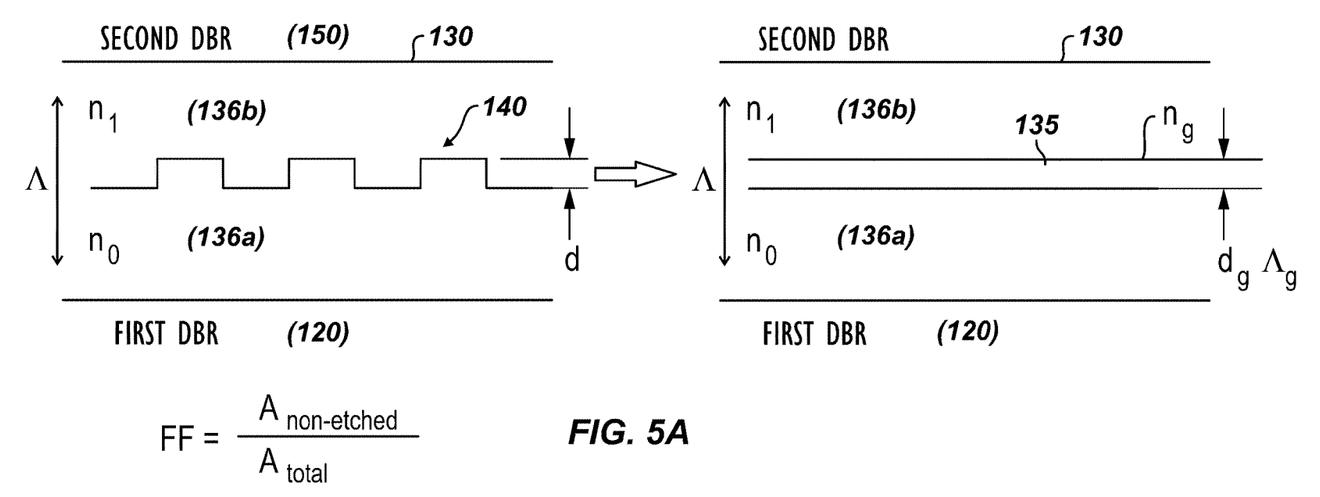
FIG. 5A illustrates a schematic of an optical cavity of the present disclosure between first and second DBRs.

To illustrates these variations in more detail, reference is made to FIG. 5, which show a schematic of an optical cavity 130 having dimensioned features 140 of the present disclosure between first and second DBRs 120, 150. As disclosed herein, the initial growth for the optical cavity 130 terminates with a layer 136a of refractive index $n_0$. This layer 136a is partially etched at a depth d using dimensioned features 140 having an etched filling factor FF. As disclosed herein, the filling factor FF is defined as the ratio between the non-etched area relative to the total area (i.e., the sum of etched and non-etched areas in a given unit area). The pattern of dimensioned features 140 is then overgrown with a layer 136b having a material of refractive index $n_1$, followed further by growth of the second DBR 150.

The resulting structure of the optical cavity 130 is equivalent to a three layer structure in which the partially etched layer can be modelled as a homogeneous thin layer 135 of refractive index $n_g$ and thickness $d_g$. When fabricated on the same wafer, the locally changing filling factor FF modifies the local thickness $d_g$ and/or the refractive index $n_g$ of the etched layer 135. The total variation $\Delta\Lambda$ in cavity's optical characteristics can then be given by the variation of the etched layer's optical thickness variation $\Lambda_g$.

As the model shows, the variation $\Lambda_g$ in optical characteristic of the equivalent etched layer 135 can be adjusted both with a variation in physical thickness (d) and a variation in refractive index (n). This can be characterized by:

$$m \times \Delta\lambda = \Delta\Lambda = \Lambda_g$$

$$\Lambda_g = n_g \times d_g$$

$n_g = n_0 FF + n_1(1-FF)$, and $d_g = d \times FF$.

m is a number of spatial wave periods (or wavelength) contained in the cavity;

$\Delta\lambda$ is a shift of Fabry Perot wavelength in which the wavelength without etching is the wavelength of reference;

n×d is the optical characteristic in which n is the refractive index of the cavity and d is the etch depth; and FF as used here is the filling factor representing the non-etched, non-recessed, or non-imprinted surface of the dimensioned features.

Here, the refractive index $n_0$ is preferably greater than $n_1$ so that the two variations (i.e., refractive index variation and physical thickness variation) do not cancel each other. In some cases, the initial refractive index $n_0$ being less than the other refractive index $n_1$ can be preferred.

Figure 5B:
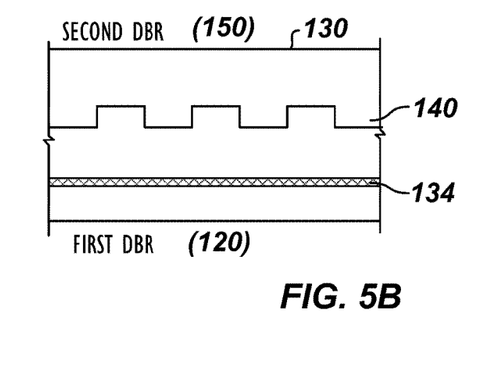
FIGS. 5B-5C illustrate other schematic views of an optical cavity of the present disclosure between first and second DBRs.
Figure 5C:
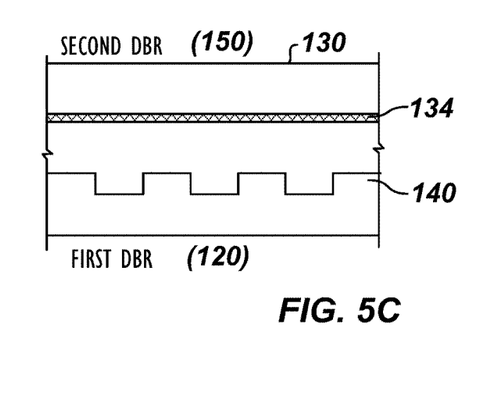

FIGS. 5B-5C illustrates other schematic views of an optical cavity 130 of the present disclosure between first and second DBRs 120, 150. As noted previously and as shown again in FIG. 5B, the dimensioned features 140 can be defined between the QW growth of the active region 134 and the second DBR 150. In another arrangement shown in FIG. 5C, the dimensioned features 140 can defined in the cavity 130 between the first DBR 120 and the QW growth of the active region 134.

Figure 6A:
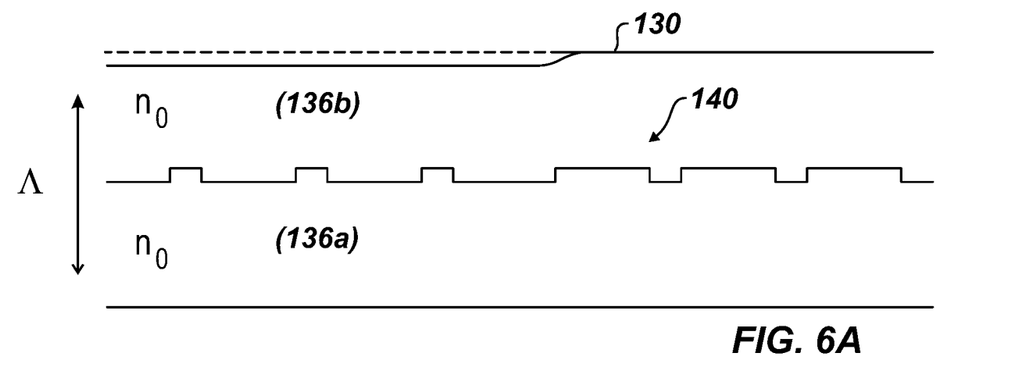
FIGS. 6A-6C schematically illustrate arrangements to achieve the wavelength tuning of the present disclosure.
Figure 6B:
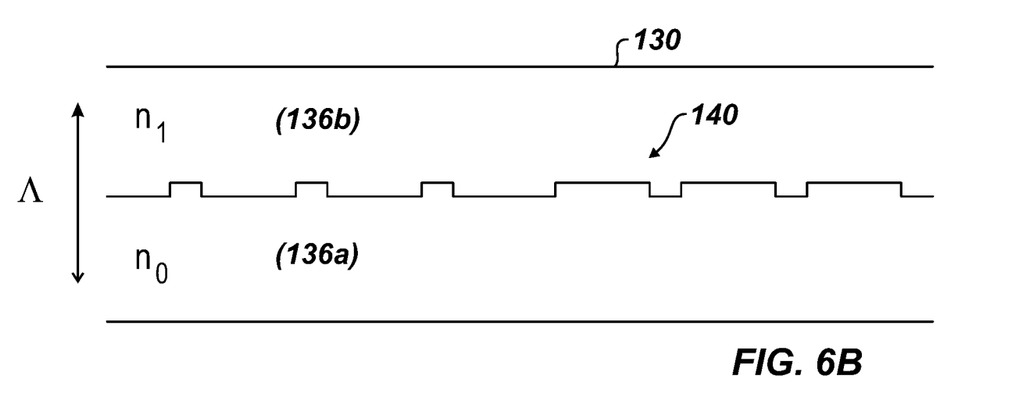
Figure 6C:
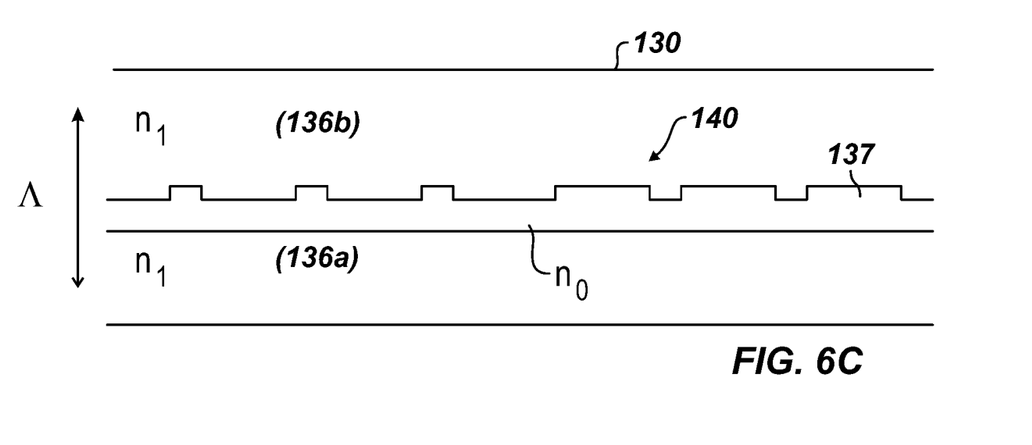

Depending on the implementation, arrangements disclosed in FIGS. 6A-6C can achieve the wavelength tuning of the present disclosure. As shown in FIG. 6A, for example, the last layer 136a of the initial growth and the first layer 136b of the overgrowth share the same refractive index n0. In this instance, only the physical cavity thickness (dg) is locally varied by the dimensioned features 140, leading to wavelength variation.

As shown in FIG. 6B, certain overgrowth conditions may planarize the surface of the overgrown layer 136b. In this case, if the one refractive index n0 does not equal the other refractive index n1 of the cavity 130, then the optical characteristics of the optical cavity 130 are only modulated by the variation of refractive index, leading to wavelength variation.

As shown in FIG. 6C, a relatively thin layer 137 of a different refractive index ($n_0$) compared to the refractive index ($n_1$) is formed on the initial cavity layer 136a. As mentioned before, it is preferable that this thin layer 137 has higher refractive index compared the rest of the cavity 130 to prevent the physical thickness variation cancelling out the refractive index variation. Etching of the dimensioned features 140 is done on the relatively thin layer 137 of the different refractive index ($n_0$), followed by overgrowth of the overgrowth cavity layer 136b having the refractive index ($n_1$). These arrangements also lead to wavelength variation.

The variation in optical characteristics of the optical cavity 130 in these arrangements of FIGS. 6A-6C gives a variation of resonating wavelength in the vertical direction of emission. Therefore, the emitted wavelength can be locally tuned with the local etched filling factor FF produced by the dimensioned features 140, as disclosed herein. The dimensioned features 140 may not be particularly configured to produce any form of resonance condition in the lateral direction.

Figure 7:
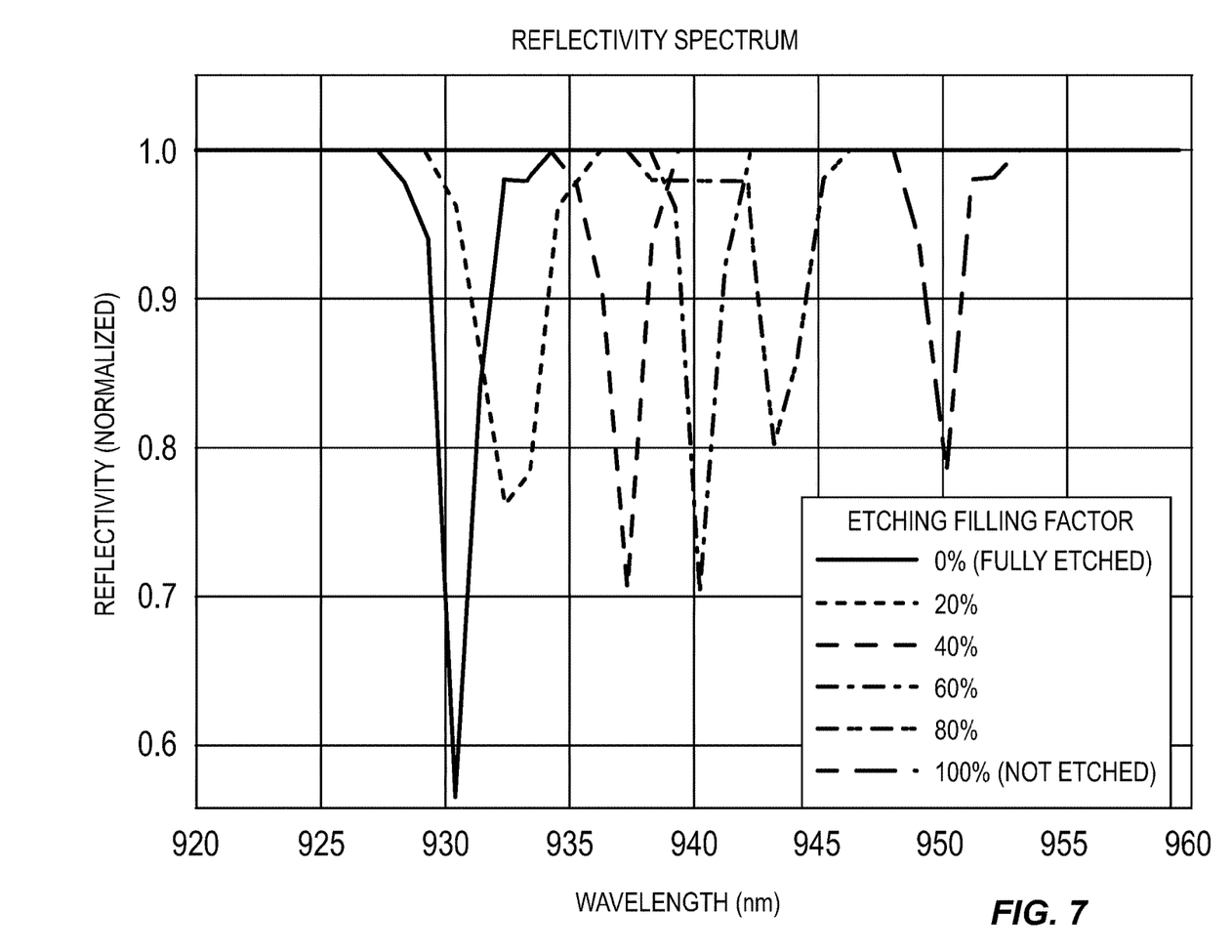
FIG. 7 graphs experimental reflectivity spectra around the Fabry Perot dip measured on a unique etched and overgrown wafer.

FIG. 7 graphs experimental reflectivity spectra around the Fabry Perot dip measured on a uniquely etched and overgrown wafer according to teachings of the present disclosure. Variation in the etched filling factor FF from 100% (not etched) toward full etching produces a blue shift in the Fabry Perot reflectivity dip, which is from 950-nm to 930-nm in this example implementation. As long as the wavelength remains within the DBR's stop band, the range of Fabry Perot dip can be configured as desired by using the etched depth and the difference between the refractive indices for the growth and overgrowth layers 136a-b of the optical cavity 130. As noted, the filling factor FF is used to vary the Fabry Perot range.

As noted, the growth of the epitaxial structure is divided into two sub-growth steps having an etching step performed in between them. Details of the structure and fabrication steps for producing one such configuration are shown in FIGS. 8A-8C.

Figure 8A:
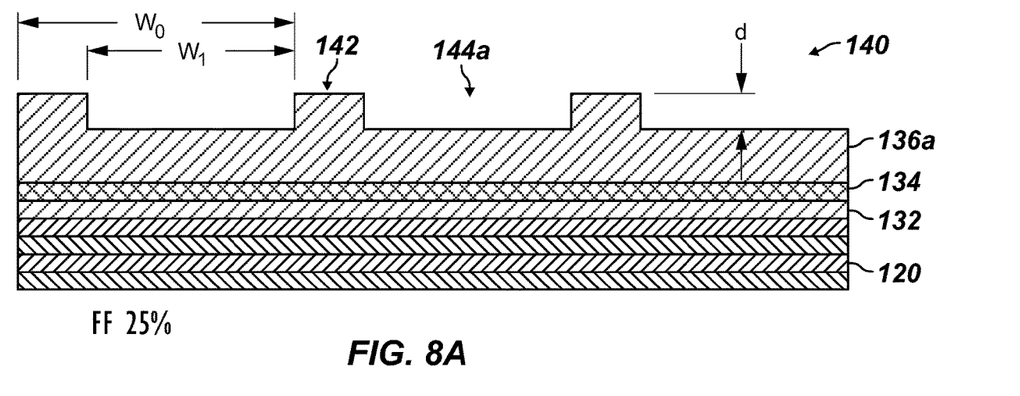
FIGS. 8A-8C illustrates detailed cross-sections of a configuration of layers of the disclosed VCSEL array having etchings during fabrication.
Figure 8B:
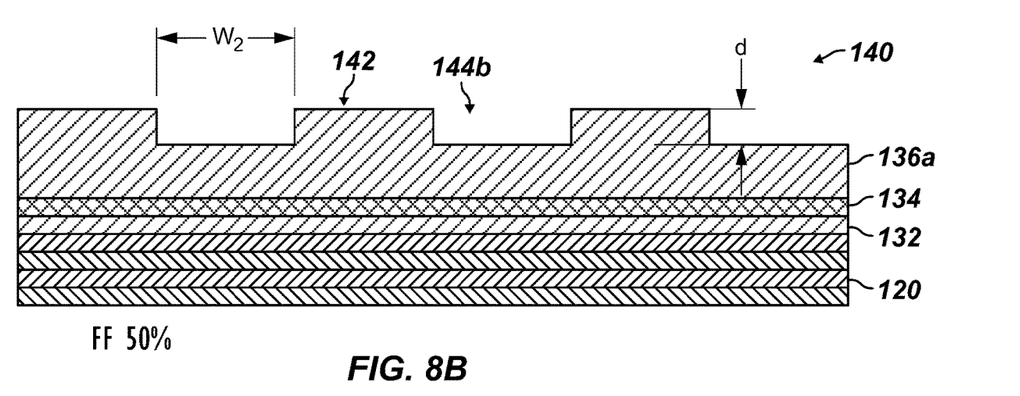
Figure 8C:
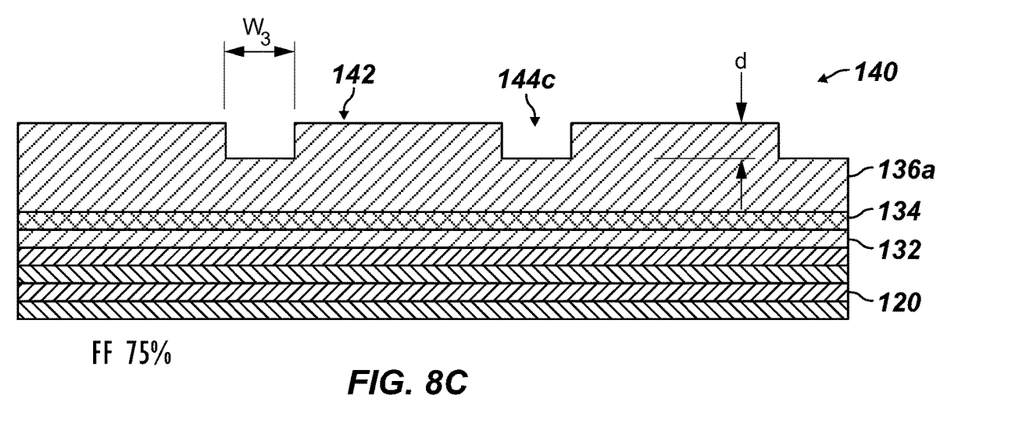

Overall in FIGS. 8A-8C, the dimensioned features 140 can have physical dimensions (depth d and width W) from a couple of micron (μm) down to a $10^{th}$ of a nanometer (nm). In general and depending on the implementation, the dimensions of the features 140 can be either $\leq \lambda$ or $>\lambda$ (the wavelength of interest). The filling factor FF is given by the repartition of the dimensioned features 140. This repartition can be either periodic or randomized. The filling factor FF can be changed from 0 to 1 with an arbitrary step, defining the number of the possible wavelengths defined on one wafer.

As mentioned above, the dimensioned features 140 of the present disclosure can have a number of shapes and configurations, such as cavities, trenches, grooves, lattices, gratings, or other profiles. As an example, a unit period ($W_0$) of about 2-μm can be used for a varying filling factor. The dimensioned features 140a-b can be etched as trenches with reactive-ion etching to a depth (d) of about 15-nm to 30-nm.

In each of FIGS. 8A-8C, the initial growth stage (210) in the fabrication process (200) involves growing the first (bottom) DBR 120, the lower cavity layer 132, the active region 134, and an initial upper cavity portion 136a. (The thickness of the layers depicted are merely provided for illustration.) The etching stage (Block 220) is then performed on the initial portion 136a. The etching step can use optical lithography and selective etching to define the dimensioned features 140 with different filling factors to ultimately modify the cavity characteristics. As is known, optical lithography is a photon-based technique in which a desired image is projected, or shadow casted, into a photosensitive emulsion (photoresist) or mask coated onto a subjected surface. Then, reactive-ion etching is used to define the dimensioned features 140 in the unmasked regions of the subjected surface. Wet etching can be used. Also, reactive-ion etching may be preferred because it is an anisotropic process having good selectivity and etch rate.

FIGS. 8A-8C show different dimensioned features 140 in the form of profiles 144a-c, such as cavities, trenches, grooves, lattices, gratings, or the like, that are spaced periodically in the planar surface 142 of the initial cavity portion 136a above the active region 134. In FIG. 8A, the profiles 144a are etched to extend parallel to one another across the plane 142 of the initial cavity portion 136a and are etched to have a first width ($W_1$) relative to a given spacing ($W_0$). The profiles 144a are etched into the plane 142 at a given depth (d). Here, the first width ($W_1$) is approximately 75% of the given spacing ($W_0$), which can give a filling factor of 25% in this example.

In FIG. 8B, the profiles 144b are etched to extend parallel to one another across the plane 142 of the initial cavity portion 136a and are etched to have a second width ($W_2$) relative to a given spacing ($W_0$). The profiles 144b are etched into the plane 142 at a given depth Here, the second width ($W_2$) is approximately 50% of the given spacing ($W_0$), which can give an example filling factor of 50%.

In FIG. 8C, the profiles 144c are etched to extend parallel to one another across the plane 142 of the initial cavity portion 136a and are etched to have a third width ($W_3$) relative to a given spacing ($W_0$). The profiles 144c are etched into the plane 142 at a given depth (d). Here, the third width ($W_3$) is approximately 25% of the given spacing ($W_0$), which can give an example filling factor of 75%.

As noted above, overgrowth follows this etching of the dimensioned features 140 to complete the remaining portion (136b) of the upper cavity layer (136) and the second (top) DBR. When multiple of such etched profiles 144a-c are arranged across the plane of the active region (134) and cavity layers (132, 136) between the DBRs (120, 150), the different wavelengths noted herein can be produced by the variation in the cavity thickness (Λ) and/or refractive index (n) generated in the fabrication.

In the above examples, only a few of the dimensioned features 140 are illustrated for simplicity, and the dimensioned features 140 are illustrated as being patterned and uniform and as being arranged in one direction. As will be appreciated with the benefit of the present disclosure, other geometric arrangements can be used at the wafer-scale during fabrication. In general, the dimensioned features 140 can define a plurality of steps of alternating depth in the plane. More or less of the individual dimensioned features 140 can be formed to produce the filling factor, and the dimensioned features 140 can be arranged more randomly while still achieving a desired filling factor per unit area. Moreover, the etched features 140 can be arranged in more than one direction on the plane of the cavity layer 134.

In the above examples, a general depth (d) of the dimensioned features 140 has been referenced. This depth (d) can be controlled by a known etch rate of the etching process so that timing of the etching process can control the etched depth (d) produced.

Figure 9A:
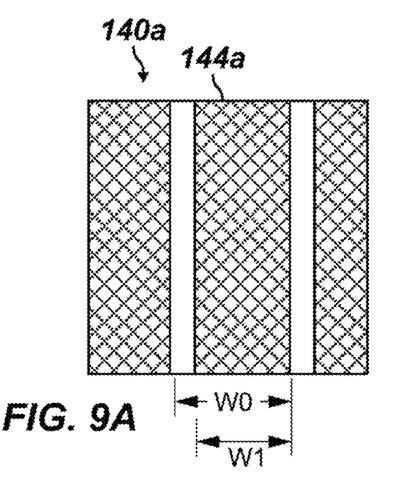
FIGS. 9A-9B show a plan view of dimensioned features formed in a plane of a cavity portion as trenches with different widths per unit area.
Figure 9B:
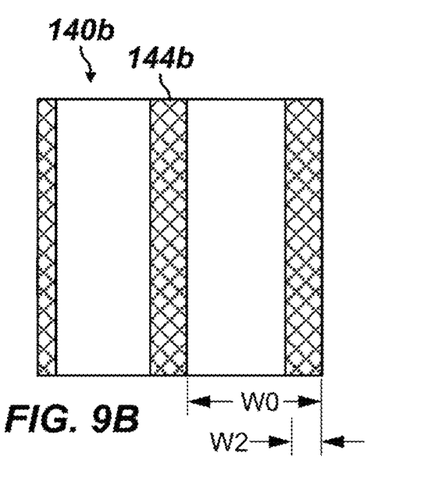

FIGS. 9A-9B show a plan view of the dimensioned features 140a-b formed in the plane of the cavity portion as elongated profiles 144a-b of different widths per unit area. In FIG. 9A, the dark regions represent profiles or trenches 144a. In one example, a filling factor FF of 0.20 can be achieved with an etched trench 144a having a depth (d) of about 20-nm and having a width $W_1$ of about 2-μm over an overall period width $W_0$ of about 2.5-μm. By contrast, a filling factor FF of 0.80 can be achieved with an etched trench 144a as shown in FIG. 9B having a depth (d) of about 20-nm and having a width $W_1$ of about 0.5-μm over an overall period width $W_0$ of about 2.5-μm.

Figure 10A:
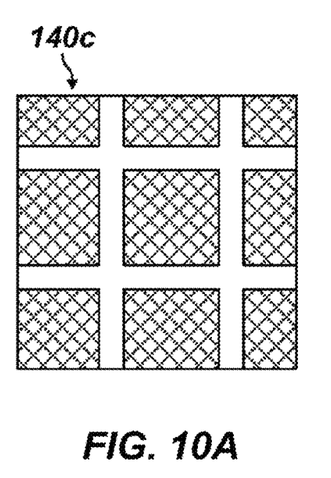
FIG. 10A-10B show a plan view of dimensioned features formed in a plane of a cavity portion as a lattice with different widths per unit area.
Figure 10B:
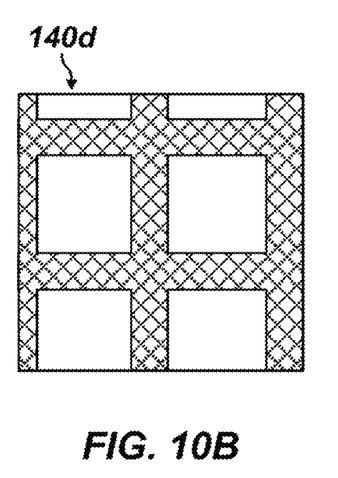

For comparison, FIGS. 10A-10B show a plan view of dimensioned features 140c-d formed in the plane of the cavity portion as a lattice of profiles with different widths per unit area. As will be appreciated, the etched features of the present disclosure can have these and other configurations.

For an area in which about 15 nm depth (d) has been etched with features 140 (and depending on other implementation details of course), a FF=0.2 can result in a cavity wavelength λFP of about 932-nm (FIG. 7), while a FF=0.8 can result in a cavity wavelength λFP of about 943-nm. When the FF=1 (no etching) and FF=0 (etched completely), the λFP can be about 950-nm and 930-nm respectively, which demonstrates a possibility for varying the wavelength in about a 20-nm window on a given VCSEL array of emitters. Changing the etch depth (d) may change the possible wavelength span. For example, doubling the etch depth (d) may also double the possible wavelength span.

In the previous examples, the depth (d) of the dimensioned features 140 are controlled by timing the etching processes. Other techniques can be used. For example, FIGS. 11A-11C illustrate detailed cross-sections of an alternative configuration of layers of the disclosed VCSEL having etchings during fabrication.

Figure 11A:
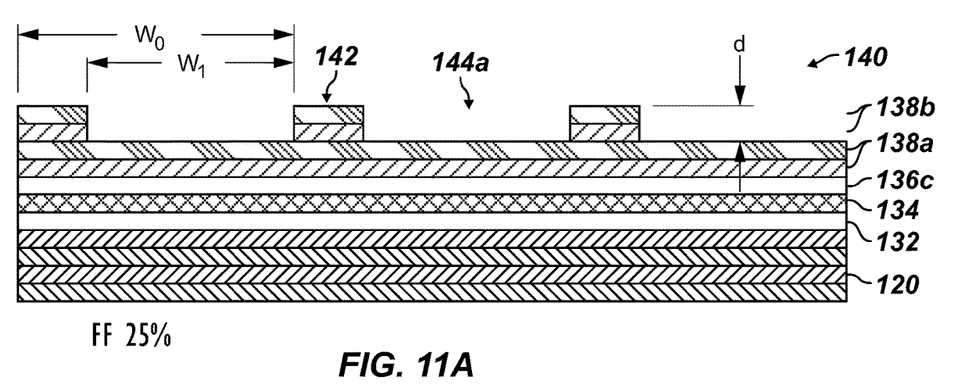
FIGS. 11A-11C illustrate detailed cross-sections of an alternative configuration of layers for the disclosed VCSEL array having etchings during fabrication.
Figure 11B:
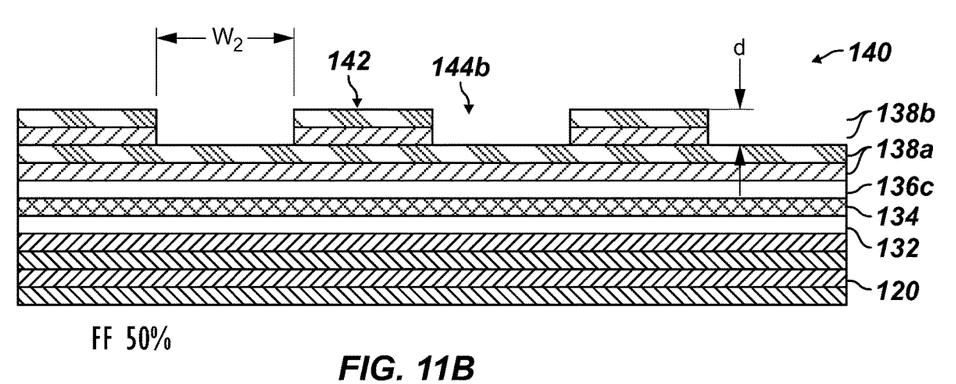
Figure 11C:
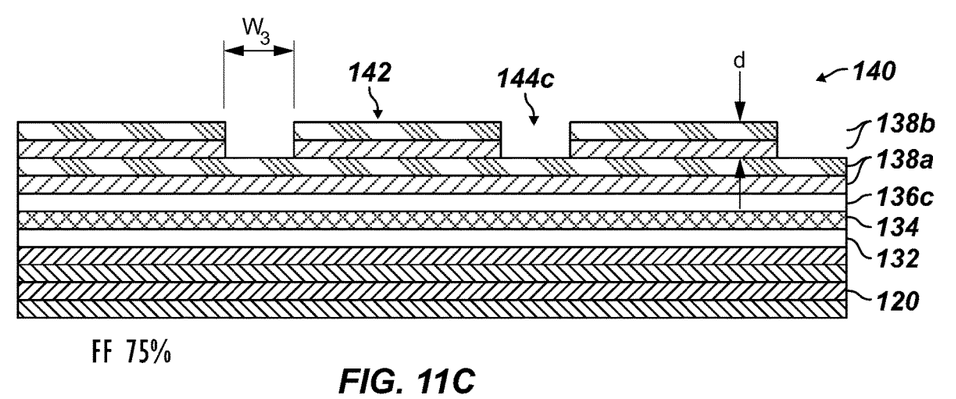

In each of FIGS. 11A-11C, the initial growth stage (210) in the fabrication process (200) involves growing the first (bottom) DBR 120, the lower cavity layer 132, the active region 134, and an initial upper cavity portion. (The thickness of the layers depicted are merely provided for illustration.) In the present configuration, the initial upper cavity portion can include a cladding layer 136c on the active region 134 and includes one or more control layer pairs 138a-b.

The etching step (Block 220) is performed on the control layer pairs 138a-b. The etching step can use optical lithography and selective etching to define the etched features with different filling factors to modify the cavity wavelength.

FIGS. 11A through 11C show different etched features 144a-c spaced periodically in the planar surface 142 of the initial cavity portion above the active region 134. In FIG. 11A, the features 144a are etched to extend parallel to one another across the plane 142 of one control layer pair 138b in the initial cavity portion and are etched to have a first width ($W_1$) relative to a given spacing ($W_0$). Etching can use iterations of selective wet etching process or other etching technique. By etching in the one control layer pair 138b, the depth (d) of the etched features 144a can be well-defined into the plane 142. Here, the first width ($W_1$) is approximately 75% of the given spacing ($W_0$), which can give a lower filling factor of 25% in this example. The features 144b in FIG. 11B and 144c in FIG. 11C can be comparably configured in one control layer pair 138b at different spacings to provide the different filing factors.

Control of the depth (d) can be achieved by the selective etching of the one or more the control layer pairs 138a-b. More layers can be provided to allow for greater etch depth (d). As will be appreciated, the two layers in the control layer pairs 138a-b can be composed of different materials, acting as stop layers to one another when exposed to different reactive etching steps.

As one skilled in the art will appreciate with the benefit of the present disclosure, various processes can be used to form the DBRs 120, 150, the optical cavity 130, and the active region 134, including metal-organic chemical vapor deposition (MOCVD), molecular beam epitaxy (MBE), and others. To confine flow of the current, various techniques can be used, such as ion implantation, lithographic apertures, and oxide apertures. Different technologies may be used to form the first and second ohmic contacts 170, 180 or to connect a contact metal layer 182 with the ohmic contact 180. As is typical, conventional photolithographic processes can be used to pattern the contact metal.

The order in which certain of the fabrication steps are performed may be varied. In addition to GaAs material systems, a variety of other material systems are available, including systems using InP, GaAs/InGaP, GaSb, GaInNAs (Sb), InGaAlAs, AlGaInP and GaN/AlInGaN. Details of such systems and others may be found in R. Michalzik (ed.), VCSELS Fundamentals, Technology and Applications of Vertical Cavity Surface-Emitting Lasers (Springer, 2013).

According to the teachings of the present disclosure, the optical cavity thickness (Λ) and/or the refractive index can be locally modified by dividing the formation of the optical cavity 130 into two sub-growths (Stages 210, 230 in FIG. 4) separated by an etching step for the dimensioned features 140 (Block 220). This approach is independent of the growth rate and can allow flexible control of the laser wavelength. The spacing between the emitters (102) for the VCSEL array 100 and their resulting wavelengths does not require large distances because the fabrication process (200) is not restricted by the complexity of tuning the growth rate found in existing techniques noted in the Background of the present disclosure. In fact, the current approach allows different wavelengths to be defined in one selective etching step (Block 220). Moreover, after the overgrowth (230), standard VCSEL fabrication processes (240) can be used.

As disclosed herein, the growth rate of the cavity 130 does not need to be varied. In alternative configurations, however, selective growth can still be used in conjunction with the etching of the features 140 for the filing factor. For example, when the overgrowth stage (230) completes the remaining portion 136b of the cavity 130, a varying growth rate could be used to further alter the optical thickness (Λ) of the cavity 130 so that a varied growth can be applied above the dimensioned features 140. If practical, the initial growth of at least the initial upper cavity 136a can use a varying growth rate as appropriate so that the dimensioned features 140 can be applied above a varied growth. Overall, the growth steps (210, 230) between the etching step (220) can use selective area growth. For some implementations, a single epitaxial run may be used to form the multiple quantum wells (MQW).

According to the teachings of the present disclosure, cavity wavelength control is achieved by etching features 140 with varying filling factor between two epitaxial growth steps in the fabrication process (200). These dimensioned features 140 can be one or two dimensional in definition and can be periodic, quasi-periodic, or randomized. For example, a checkerboard pattern can be produced from repeated exposures and etching. This cavity wavelength control is independent from the VCSEL fabrication process 200. Moreover, as already noted, the cavity wavelength control can be used with either an oxide aperture VCSEL or a lithographic aperture VCSEL.

The foregoing description of preferred and other embodiments is not intended to limit or restrict the scope or applicability of the inventive concepts conceived of by the Applicants. It will be appreciated with the benefit of the present disclosure that features described above in accordance with any embodiment or aspect of the disclosed subject matter can be utilized, either alone or in combination, with any other described feature, in any other embodiment or aspect of the disclosed subject matter.

In exchange for disclosing the inventive concepts contained herein, the Applicants desire all patent rights afforded by the appended claims. Therefore, it is intended that the appended claims include all modifications and alterations to the full extent that they come within the scope of the following claims or the equivalents thereof.

What is claimed is:

1. A method to fabricate a vertical cavity surface emitting laser (VCSEL) capable of optical emission, the method comprising:
    forming a first distributed Bragg reflector (DBR) on a substrate;
    forming, on the first DBR, an optical layer having an active region by:

forming a first portion of the optical layer on the first DBR;

forming a plurality of dimensioned features on a surface of the first portion, at least one of the dimensioned features being different from the other dimensioned features; and forming a second portion of the optical layer by filling the plurality of dimensioned features on the surface of the first portion; and forming a second DBR on the optical layer, wherein forming the second portion of the optical layer includes forming at least one layer of the second DBR on the plurality of dimensioned features, and wherein the at least one layer of the second DBR comprises the second portion of the optical layer.

2. The method of claim 1, wherein the dimensioned features produce a variation in an optical characteristic of the optical layer, the variation being configured to generate a plurality of wavelengths in the optical emission of the VCSEL.

3. The method of claim 2, wherein the variation in the optical characteristic comprises a variation in refractive index, a variation in physical thickness, or variations in both refractive index and physical thickness of the optical layer.

4. The method of claim 1, wherein the plurality of dimensioned features comprises one or more of profiles, cavities, wells, trenches, and gratings defined in the surface of the first portion of the optical layer.

5. The method of claim 1, further comprising forming an aperture layer between the active region and the second DBR, and forming an aperture in the aperture layer, the aperture being configured to confine current along a longitudinal axis.

6. The method of claim 1, further comprising forming an aperture using ion implantation, an oxidation process, or lithographic process.

7. The method of claim 1, further comprising:

forming at least one first ohmic contact adjacent the first DBR; and forming at least one second ohmic contact adjacent the second DBR.

8. The method of claim 1, wherein forming each of the first and second DBRs comprises forming alternating layers of materials having different indices of refraction and having a thickness configured to an operating parameter for an array.

9. The method of claim 1, wherein forming the first portion of the optical layer comprises:

forming first cladding on the first DBR;

forming the active region with a plurality of quantum wells on the first cladding; and forming second cladding on the active region.

10. The method of claim 9, wherein forming the dimensioned features on the surface of the first portion of the optical layer comprises:

defining the plurality of dimensioned features with photolithography on the surface of the second cladding, and etching the the plurality of dimensioned features in the surface of the second cladding using an etching process;

defining the plurality of dimensioned features using electron-beam lithography on the surface of the second cladding and etching the the plurality of dimensioned features in the surface of the second cladding using an etching process; or defining the plurality of dimensioned features using nanoimprint lithography on the surface of the second cladding and etching the the plurality of dimensioned features in the surface of the second cladding using an etching process.

11. The method of claim 10, wherein forming the second portion of the optical layer by filling the plurality of dimensioned features comprises forming third cladding on the surface having the plurality of dimensioned features.

12. The method of claim 11, wherein forming the third cladding on the surface comprises forming the third cladding having a refractive index being (i) comparable to that of the second cladding, (ii) greater than that of the second cladding, or (iii) being less than that of the second cladding.

13. The method of claim 1, wherein forming the second portion of the optical layer comprises:

epitaxially growing the second portion using Metalorganic Vapor-Phase Epitaxy (MOVPE) or Molecular Beam Epitaxy (MBE).

14. The method of claim 1, wherein forming the first portion of the optical layer comprises:

forming first cladding on the first DBR, the first cladding having a first refractive index; and forming second cladding on the first cladding, the second cladding having a second refractive index greater than the first refractive index, wherein forming the plurality of dimensioned features on the surface of the first portion of the optical layer comprises forming the plurality of dimensioned features on the second cladding, wherein forming the second portion of the optical layer comprises forming third cladding on the second cladding and filling the plurality of dimensioned features, and wherein the third cladding has a third refractive index comparable to the first refractive index.

15. The method of claim 1, wherein forming the plurality of dimensioned features on the surface comprises defining a plurality of profiles over a surface area of the surface, wherein the plurality of profiles having at least a plurality of widths across the surface area.

16. The method of claim 15, wherein defining the plurality of profiles comprises:

defining the plurality of profiles having at least one depth in the surface;

defining the profiles in a randomized pattern, in a uniform pattern, or in one or more directions; or defining a plurality of steps of alternating depth in the surface.

17. The method of claim 1, wherein forming the first portion of the optical layer comprises forming at least one pair of control layers of different materials, and wherein forming the plurality of dimensioned features on the surface of the first portion of the optical layer comprises forming the plurality of dimensioned features by selectively etching the at least one pair of control layers using iterations of selective etching.

18. The method of claim 1, further comprising:

forming the VCSEL into a plurality of VCSEL emitters for one or more individually addressable VCSEL arrays; or forming the VCSEL into a plurality of individually addressable VCSEL emitters.

19. A vertical cavity surface emitting laser (VCSEL) fabricated by the method according to claim 1.

20. A vertical cavity surface emitting laser (VCSEL) array having a plurality of VCSELs fabricated by the method according to claim 1.

* * * * *